(12) United States Patent
Tokuda

(10) Patent No.: US 9,307,642 B2
(45) Date of Patent: Apr. 5, 2016

(54) PRINTED BOARD, PRINTED BOARD UNIT, AND METHOD OF MANUFACTURING PRINTED BOARD

(71) Applicant: FUJITSU LIMITED, Kawasaki-shi, Kanagawa (JP)

(72) Inventor: Kazuhiko Tokuda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 251 days.

(21) Appl. No.: 14/108,535

(22) Filed: Dec. 17, 2013

(65) Prior Publication Data
US 2014/0268618 A1 Sep. 18, 2014

(30) Foreign Application Priority Data
Mar. 18, 2013 (JP) .................................. 2013-055734

(51) Int. Cl.
H05K 1/11 (2006.01)
H05K 3/40 (2006.01)
H05K 1/02 (2006.01)

(52) U.S. Cl.
CPC .............. *H05K 1/115* (2013.01); *H05K 3/4046* (2013.01); *H05K 1/0216* (2013.01); *H05K 1/113* (2013.01); *Y10T 29/49165* (2015.01)

(58) Field of Classification Search
USPC ........... 174/250–264; 361/767–774, 795, 803
See application file for complete search history.

(56) References Cited

U.S. PATENT DOCUMENTS

| | | | |
|---|---|---|---|
| 6,091,310 A | 7/2000 | Utsumi et al. | |
| 6,670,921 B2 * | 12/2003 | Sievenpiper | H01P 1/2005 343/700 MS |
| 7,423,608 B2 * | 9/2008 | Dunn | H05K 1/162 343/700 MS |
| 8,227,704 B2 * | 7/2012 | Park | H05K 1/0236 174/256 |

FOREIGN PATENT DOCUMENTS

| | | |
|---|---|---|
| JP | 05-013649 A | 1/1993 |
| JP | 10-270855 A | 10/1998 |
| JP | 2000-223841 A | 8/2000 |

\* cited by examiner

*Primary Examiner* — Tuan T Dinh
(74) *Attorney, Agent, or Firm* — Squire Patton Boggs (US) LLP

(57) ABSTRACT

A printed-board includes a first conductor-layer, a second conductor-layer provided to a layer different from the first conductor-layer, an insulation-layer provided between the first conductor-layer and the second conductor-layer, a plurality of through-holes that pass through the first conductor-layer, the second conductor-layer, and the insulation-layer, and a plurality of vias that are formed in the plurality of through-holes, respectively, and couple the first conductor-layer and the second conductor-layer, each of the plurality of vias including a conductor portion that occupies part of an internal space of the through-hole, and a non-conductor portion that occupies remaining part of the internal space, wherein in a given pair of vias adjacent to each other, the conductor portion of one of the pair of vias is arranged so as to face the non-conductor portion of another one of the pair of vias.

17 Claims, 11 Drawing Sheets

PRINTED BOARD, PRINTED BOARD UNIT, AND METHOD OF MANUFACTURING PRINTED BOARD

CROSS-REFERENCE TO RELATED APPLICATION

This application is based upon and claims the benefit of priority of the prior Japanese Patent Application No. 2013-055734, filed on Mar. 18, 2013, the entire contents of which are incorporated herein by reference.

FIELD

The embodiment discussed herein is related to a printed board, a printed board unit, and a method of manufacturing the printed board.

BACKGROUND

A technique for coupling wiring patterns of upper layers and lower layers using vias is widely used for a printed board on which a semiconductor element, such as a large scale integration (LSI) chip, is mounted. When a plurality of vias for coupling signal lines of different layers are adjacent to one another in a printed board, noise may be caused by crosstalk among the adjacent vias, which is hereinafter referred to as crosstalk noise.

Particularly in recent years, as the communication speed or the processing speed of an electronic apparatus increases, the speed of signal transmission between an LSI chip and a printed board has been demanded to be higher while crosstalk has been easily caused among adjacent vias. Thus, the occurrence of the crosstalk noise have been suppressed typically by widening clearances among adjacent vias.

Japanese Laid-open Patent Publication No. 5-13649, Japanese Laid-open Patent Publication No. 10-270855, and Japanese Laid-open Patent Publication No. 2000-223841 are examples of related art.

The clearances among vias in a printed board are desired to correspond to the pitches of coupling terminals in LSI to be mounted. The pitches of coupling terminals in LSI have been narrowed every year because of the demand for the higher LSI density. Such a situation has made it more and more difficult to ensure sufficient clearances among vias so as to suppress the occurrence of crosstalk noise.

The present application is conceived in view of the above-described problem and is aimed at providing a printed board, a printed board unit, and a method of manufacturing the printed board, which may suppress the occurrence of crosstalk noise among vias even when the clearances among the vias are narrow.

SUMMARY

According to an aspect of the application, a printed board includes a first conductor layer, a second conductor layer provided to a layer different from the first conductor layer, an insulation layer provided between the first conductor layer and the second conductor layer, a plurality of through holes that pass through the first conductor layer, the second conductor layer, and the insulation layer, and a plurality of vias that are formed in the plurality of through holes, respectively, and couple the first conductor layer and the second conductor layer, each of the plurality of vias including a conductor portion that occupies part of an internal space of the through hole, and a non-conductor portion that occupies remaining part of the internal space, wherein in a given pair of vias adjacent to each other, the conductor portion of one of the pair of vias is arranged so as to face the non-conductor portion of another one of the pair of vias.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

A printed board, a printed board unit, and a method of manufacturing the printed board are described in detail below with reference to drawings.

Embodiment

Printed Board and Printed Board Unit

Figure 1:
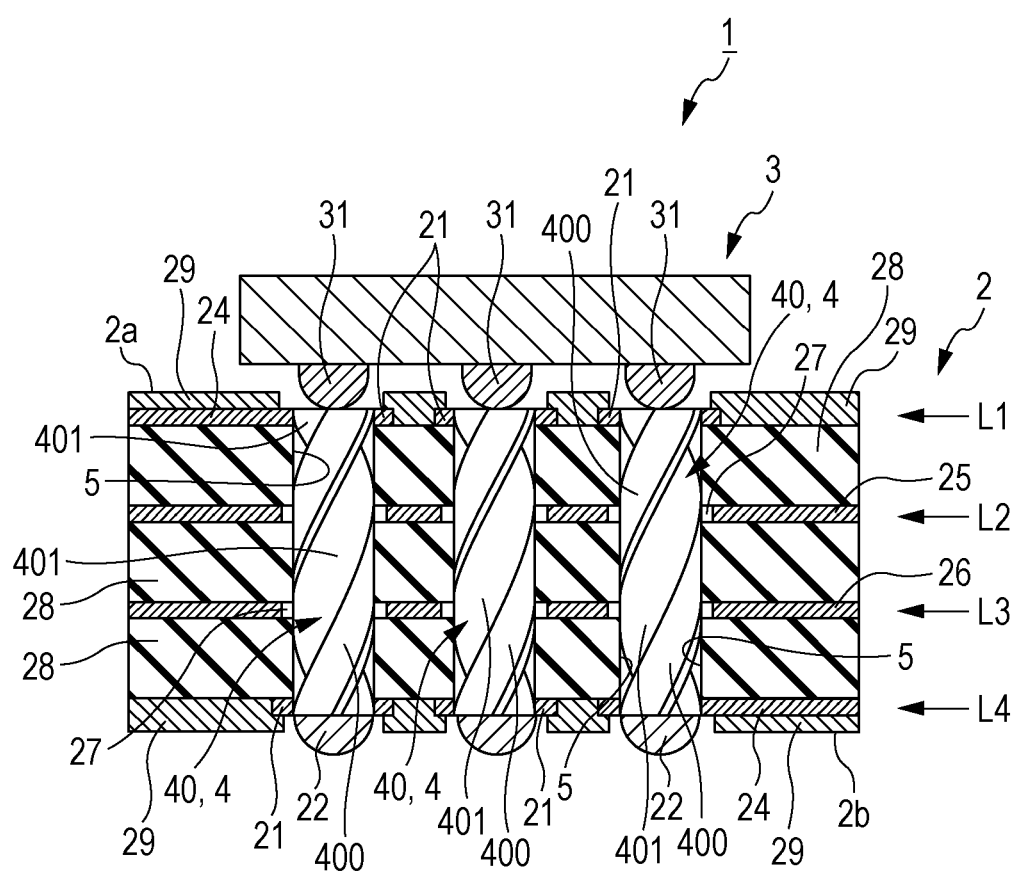
FIG. 1 is a schematic view illustrating a sectional structure of a printed board unit according to an embodiment.

FIG. 1 is a schematic view illustrating a sectional structure of a printed board unit 1 according to an embodiment. For example, the printed board unit 1 is accommodated in a housing of an electronic apparatus, such as a computer. The printed board unit 1 includes a printed board 2, and a semiconductor element 3 mounted over the printed board 2. The semiconductor element 3 is, for example, a large scale integration (LSI) chip. The semiconductor element 3 is mounted and fixed over an upper surface 2a of the printed board 2 by a face-down (flip-chip) technique. In the present embodiment, the upper surface 2a of the printed board 2 is a surface over which the semiconductor element 3 is mounted. The semiconductor element 3 is a high-frequency semiconductor element that processes high-frequency signals, and employs a transmission technique by which signals are transmitted at an operation frequency of, for example, 2.5 GHz or higher.

A plurality of coupling terminals 31 formed of, for example, solder balls or the like are provided to a lower surface of the semiconductor element 3. The coupling terminals 31 of the semiconductor element 3 are coupled to pads 21, which are electrode portions provided to the upper surface 2a of the printed board 2. The pads 21 are formed at positions corresponding to vias 4, which are electrodes passing through the printed board 2 in the thickness direction. The via 4 is formed inside a through hole 5 passing through the printed board 2 in the thickness direction and in the present embodiment, is formed by inserting an electrode chip 40 into the through hole 5. The electrode chip 40 is described in detail below. The pads 21 are also provided at certain positions of a lower surface 2b of the printed board 2, which is opposite the upper surface 2a, and a plurality of solder bumps 22 are provided to the pads 21.

The printed board 2 is a multilayer printed wiring board, which a plurality of wiring layers having certain wiring patterns make up by lying over or between insulation layers. The printed board 2 is formed by laminating a plurality of insulation substrates of glass cloth epoxy resin or the like, and for example, a conductor pattern is formed on the surfaces of the insulation substrates. In the example illustrated in FIG. 1, the printed board 2 has a four-layer structure including a first layer L1, a second layer L2, a third layer L3, and a fourth layer L4, which are wiring layers. Each of the first layer L1 and the fourth layer L4 includes the pads 21 and signal lines (signal patterns) 24 coupled to the pads 21. The first layer L1 and the fourth layer L4 are examples of a first conductor layer and a second conductor layer. The second layer L2 includes a power supply plane 25, and the third layer L3 includes a ground plane 26. The second layer L2 and the third layer L3 are used as a power supply layer and a ground layer, respectively.

The power supply plane 25 and the ground plane 26 planarly extend in the plane direction of the printed board 2 and are formed as so-called solid patterns. For example, the signal line 24, the power supply plane 25, the ground plane 26, and the pad 21 are formed of, for example, conductors of copper (Cu) or the like. A non-conductor region 27, in which the power supply plane 25 is not present, is formed like a ring (donut) around the through hole 5 in the second layer L2 and thus, the signal lines 24 and the power supply plane 25 are decoupled in the first layer L1 and the fourth layer L4. Similarly, the non-conductor region 27, in which the ground plane 26 is not present, is formed like a ring around the through hole 5 in the third layer L3 and thus, the signal lines 24 and the ground plane 26 are decoupled in the first layer L1 and the fourth layer L4. Furthermore, insulation layers 28 made of insulation resin are formed between the first layer L1 and the second layer L2, between the second layer L2 and the third layer L3, and between the third layer L3 and the fourth layer L4. Each of the upper surface 2a and the lower surface 2b of the printed board 2 is covered with a solder resist 29 that serves as a protection film. The solder resist 29 is provided with openings at certain positions, and the solder bumps 22 and the coupling terminals 31 of the semiconductor element 3 are coupled to the pads 21 exposed through the openings.

[[Electrode Chip]]

Figure 2:
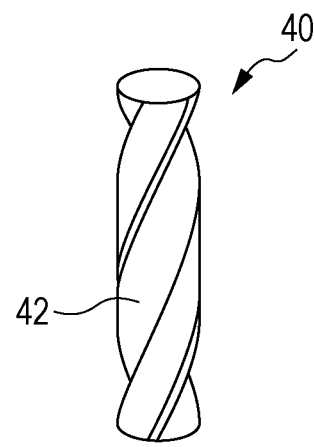
FIG. 2 is a perspective view of an electrode chip according to the embodiment.
Figure 3:
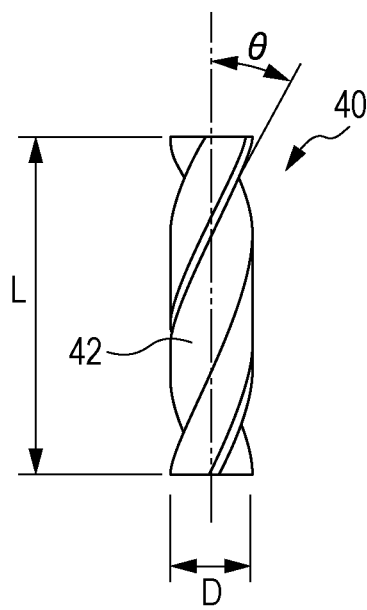
FIG. 3 is a side view of the electrode chip according to the embodiment.
Figure 4:
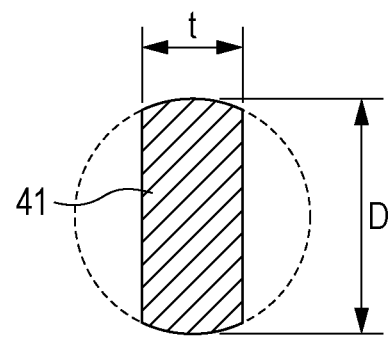
FIG. 4 is a view illustrating a core material that forms the electrode chip according to the embodiment.

The electrode chip 40 according to the present embodiment, which is columnar and forms the via 4, is described now in detail. FIG. 2 illustrates a perspective view of the electrode chip 40 according to the embodiment, and FIG. 3 illustrates a side view of the electrode chip 40. The electrode chip 40 is a conductor chip having a spiral shape like a so-called drill edge, and is formed of, for example, Cu or the like. Hereinafter, the direction in which a spiral axis extends in the electrode chip 40 is defined as the "axis direction". In the electrode chip 40, a portion corresponding to the drill diameter of the drill edge is referred to as a "chip diameter D". As illustrated in FIG. 4, the electrode chip 40 is formed into a spiral shape by twisting (turning) a core material 41 with a core thickness t, which is roughly equivalent to, for example, 40% to 50% of the chip diameter D. The ratio of the core thickness t to the chip diameter D in the core material 41 is not limited to the range described above and may be changed as appropriate.

When the spiral conductor portion in the electrode chip 40 is referred to as a body portion, a groove portion 42 is formed in the spiral made by the body portion. A "torsion angle θ", which is defined as the angle with respect to the spiral axis of the spiral in the electrode chip 40, may be changed as appropriate. The length of the electrode chip 40 in the axis direction, hereinafter referred to simply as an "axis length L", is adjusted so as to be equal to the via depth of the via 4 and in the present embodiment, is approximately the same as a total of the thicknesses of the first layer L1 to the fourth layer L4 of the printed board unit 1. The electrode chip 40 described with reference to FIGS. 2 to 4 may be manufactured by, for example, a technique similar to a technique of manufacturing a microdrill, such as extrusion or pressing.

[[Manufacturing Method]]

Figure 5:
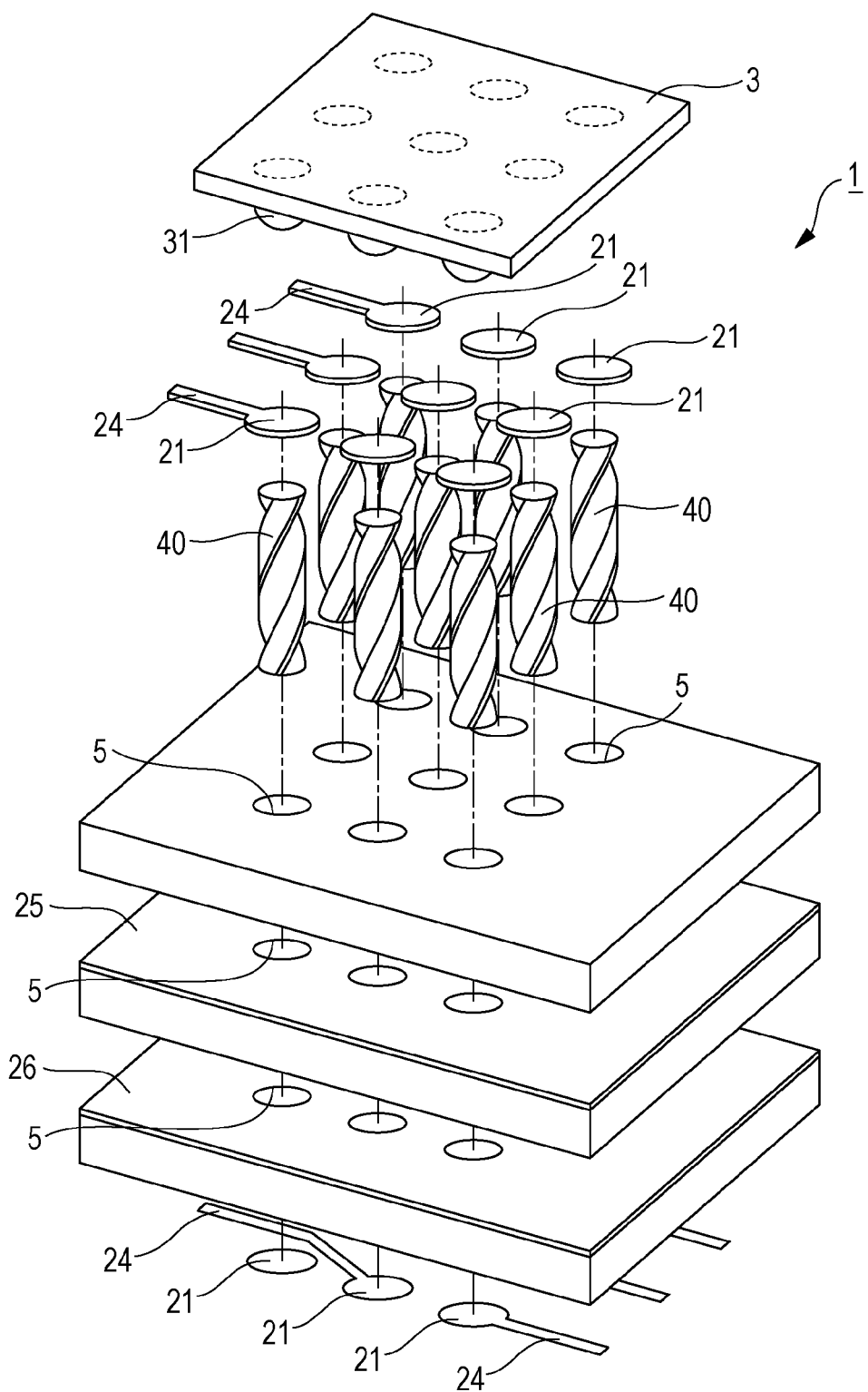
FIG. 5 is a schematic view illustrating a structure of the printed board unit according to the embodiment.

Manufacturing processes of the printed board unit 1 using the electrode chip 40 are now described. FIG. 5 is a schematic view illustrating a structure of the printed board unit 1 according to the embodiment. FIGS. 6 to 9 are views for explaining the manufacturing processes of the printed board unit 1 according to the embodiment.

Figure 6:
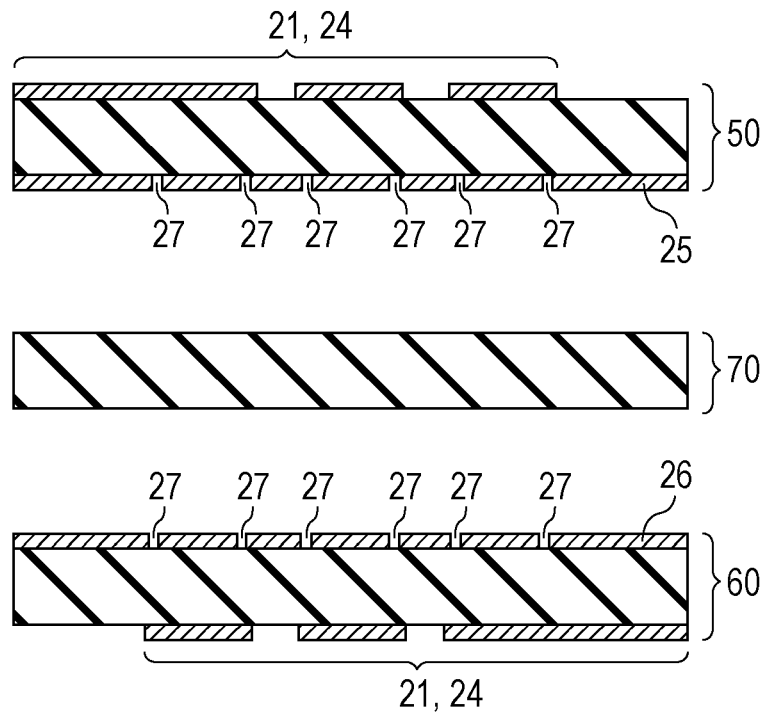
FIG. 6 is a first view for explaining manufacturing processes of the printed board unit according to the embodiment.

As illustrated in FIG. 6, a first resin sheet 50, a second resin sheet 60, and a prepreg 70 are prepared. The pads 21 and the signal lines 24 are provided to an upper surface of the first resin sheet 50, and the power supply plane 25 is provided to a lower surface of the first resin sheet 50. The non-conductor regions 27 are formed at certain positions in the power supply plane 25 of the first resin sheet 50. The ground plane 26 is provided to an upper surface of the second resin sheet 60, and the pads 21 and the signal lines 24 are provided to a lower surface of the second resin sheet 60. The non-conductor regions 27 are formed at certain positions in the ground plane 26 of the second resin sheet 60. For example, each of the first resin sheet 50 and the second resin sheet 60 is made by forming a certain conductor pattern onto a copper foil on a surface of a double-sided copper-clad laminate. For example, the copper-clad laminate is formed into a plate shape by combining a copper foil and a sheet that is obtained by impregnating a base material, such as glass fiber cloth, with thermosetting insulation resin, such as epoxy resin, and then applying heat and pressure. The prepreg 70 is a resin sheet obtained by hardening a base material by approximately half after the base material, such as glass fiber cloth, has been impregnated with thermosetting insulation resin, such as epoxy resin.

Figure 7:
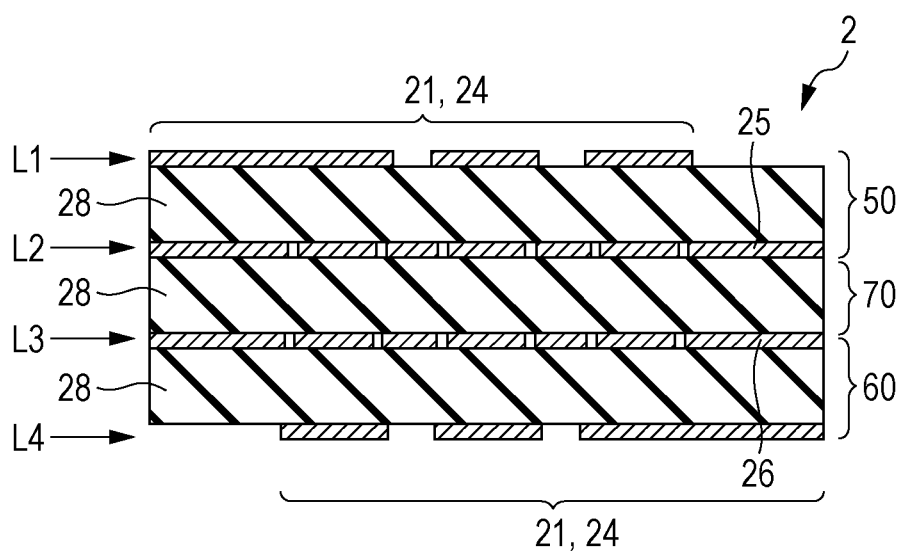
FIG. 7 is a second view for explaining the manufacturing processes of the printed board unit according to the embodiment.

After that, the prepreg 70 is arranged so as to be sandwiched between the first resin sheet 50 and the second resin sheet 60. The first resin sheet 50, the prepreg 70, and the second resin sheet 60 are formed while being aligned and are collectively laminated by vacuum heating pressing. Then, the prepreg 70 thermally hardens, and the first resin sheet 50 and the second resin sheet 60 are adhered through the prepreg 70. As a result, the printed board 2 is formed as illustrated in FIG. 7, in which the first layer L1 to the fourth layer L4 are laminated in sequence and the insulation layers 28 of insulation resin are formed among the layers. In this state, none of the through holes 5 is formed into the printed board 2.

Figure 8:
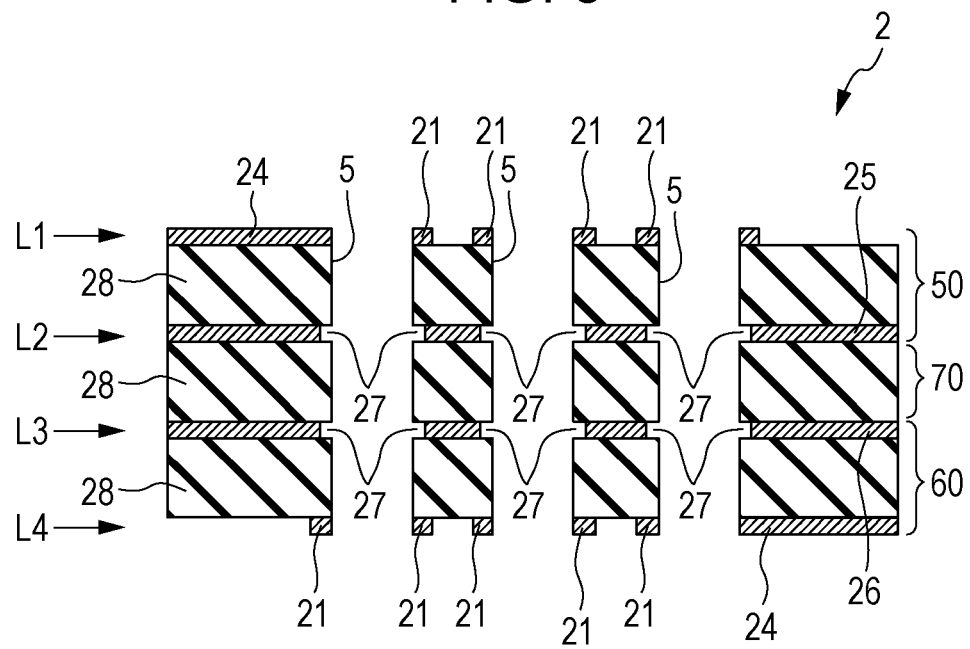
FIG. 8 is a third view for explaining the manufacturing processes of the printed board unit according to the embodiment.

After that, as illustrated in FIG. 8, the through holes 5 are made at certain positions located in the plane direction of the printed board 2. The through hole 5 is a through hole passing through the printed board 2 in the thickness direction. That is, in the present embodiment, the through holes 5 are provided so as to pass through the layers, from the surface of the first layer L1 to the surface of the fourth layer L4, which form outer layers of the printed board 2. As a technique of making the through holes 5, for example, ablation processing using a laser, cutting processing using a drill, or the like may be employed as appropriate. Examples of the laser that may be used include a carbon dioxide laser, an ultraviolet yttrium aluminum garnet (UV-YAG) laser, and an excimer laser. The through holes 5 are formed through the printed board 2 at positions at which the vias 4 are desired to be formed.

As illustrated in FIG. 8, in the first layer L1 and the fourth layer L4, each of the pads 21 is formed like a ring so as to surround the periphery of the through hole 5. In the second layer L2 and the third layer L3, each of the non-conductor regions 27 is formed like a ring so as to surround the periphery of the through hole 5.

Figure 9:
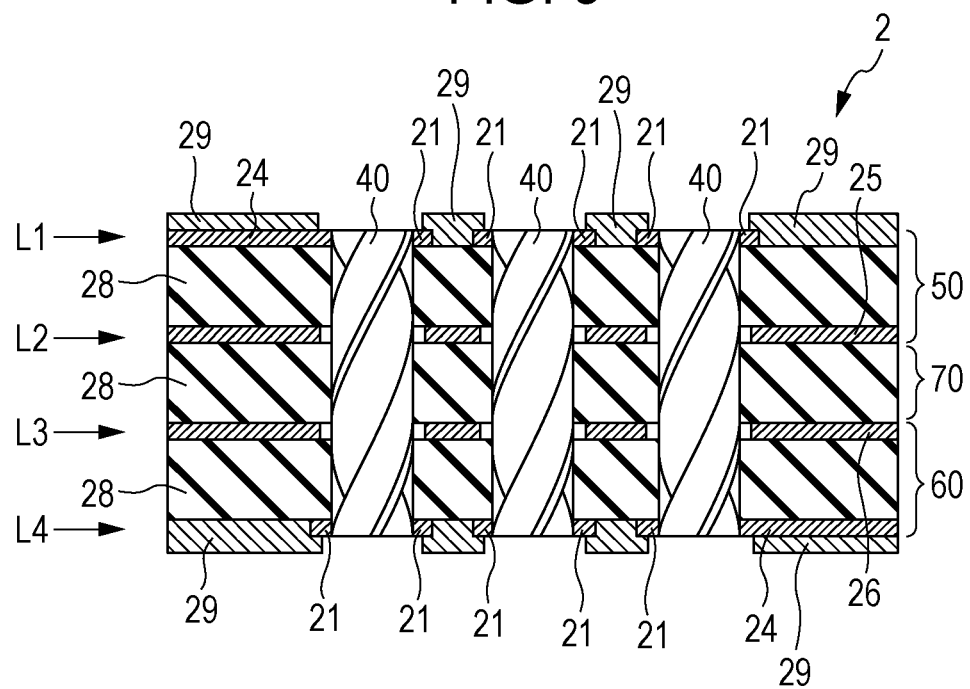
FIG. 9 is a fourth view for explaining the manufacturing processes of the printed board unit according to the embodiment.

After that, as illustrated in FIG. 9, the electrode chip 40 is inserted and embedded in each of the through holes 5 of the printed board 2. In this state, none of conductor films, such as plated materials, is formed on the inner surface of the through hole 5 made into the printed board 2. The electrode chip 40 has been described with reference to FIGS. 2 to 4. The axis length L of the electrode chip 40 is adjusted so as to be the same as the length of the through hole 5, that is, the via depth of the via 4 to be formed. The chip diameter D of the electrode chip 40 is adjusted so as to be the same as the via diameter, which is the diameter of the through hole 5 (via 4). Thus, when each of the electrode chips 40 is inserted into each of the through holes 5, the electrode chips 40, which has a spiral shape, is electrically coupled to the pads 21 of the first layer L1 and the pads 21 of the fourth layer L4. In the second layer L2 and the third layer L3, since the non-conductor regions 27 are formed so as to surround the peripheries of the through holes 5, the electrode chips 40 are electrically decoupled from the power supply plane 25 and the ground plane 26. The electrode chip 40 is arranged in each of the through holes 5 such that the via 4 is formed. The vias 4 pass through the printed board 2 in the thickness direction and are electrically coupled to the pads 21 that are provided to the first layer L1 and the fourth layer L4, respectively, in the printed board 2. As a result, the signal lines 24 of the first layer L1 and the fourth layer L4 in the printed board 2 are coupled to each other through the vias 4. After that, the surfaces of the first layer L1 and the fourth layer L4 are coated with the solder resist 29 and then openings are formed at certain positions to expose both end surfaces of the pads 21 and the electrode chips 40 to the outside.

Subsequently, the semiconductor element 3 is mounted on the side of the upper surface 2a of the printed board 2 and the solder bumps 22 are formed on the side of the lower surface 2b. Then, the printed board unit 1 illustrated in FIG. 1 is completed. In mounting the semiconductor element 3, the coupling terminals 31 provided to the lower surface of the semiconductor element 3 are joined to the end surfaces of the electrode chips 40 that form the vias 4. Since the electrode chips 40 are electrically coupled to the pads 21 of the first layer L1, the solder bumps 22 and the vias 4 may be brought into conduction by coupling the coupling terminals 31 of the semiconductor element 3 to the pads 21.

The electrode chip 40 inserted in the through hole 5 has a spiral shape as described above. Thus, a conductor portion 400 is made in part of the through hole 5, which is occupied by the electrode chip 40 as a conductor, and a non-conductor portion 401 is made in the remaining part of the through hole 5, which is not occupied by the electrode chip 40. The non-conductor portion 401 is a vacant portion (clearance portion) formed between the spiral curves of the electrode chip 40, and is formed of a groove portion 42. In this manner, the via 4 is formed so as to include the conductor portion 400, which occupies part of the internal space of the through hole 5, and the non-conductor portion 401, which occupies the remaining part of the internal space of the through hole 5. The conductor portions 400 of the plurality of vias 4 in the printed board 2 are turned to wind in an identical direction.

Figure 10:
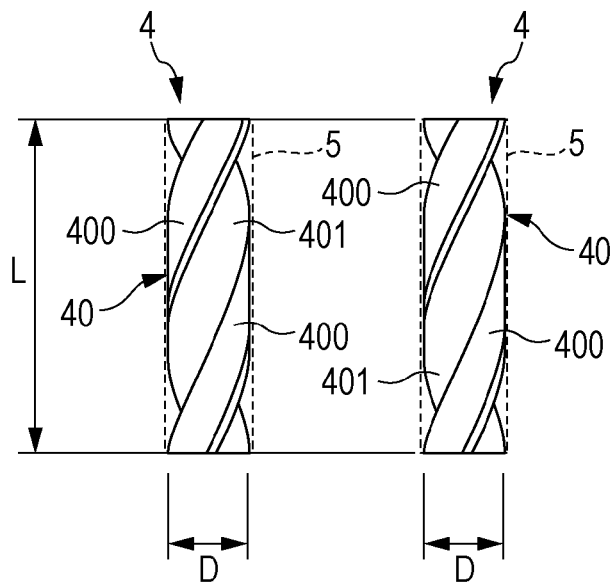
FIG. 10 is a view for explaining the correlation between vias adjacent to each other in a printed board.

FIG. 10 is a view for explaining the correlation between the vias 4 adjacent to each other in the printed board 2. As described above, the via 4 includes the conductor portion 400, which corresponds to the electrode chip 40 having a spiral shape, and the non-conductor portion 401, which corresponds to the groove portion 42 of the electrode chip 40. In the present embodiment, the conductor portion 400 in one of the vias 4, which make up a pair, is arranged so as to face the non-conductor portion 401 of the other via 4 by inserting the electrode chip 40 having a spiral shape into the through hole 5. It may be satisfactory that the region in which the conductor portion 400 in one of the pair of vias 4 is arranged so as to face the non-conductor portion 401 of the other via 4 is formed at least in a partial section in the direction in which the vias 4 extend, that is, the axis direction. As a result, the possibilities of causing crosstalk between the adjacent vias 4 may be decreased and the occurrence of the crosstalk noise may be suppressed more desirably. Advantages of reducing the crosstalk noise with the vias 4 according to the present embodiment are described in detail below.

The pair of vias 4 adjacent to each other may be regarded as parallel wiring. When signals are transmitted between the printed board 2 and the semiconductor element 3 at a high speed as in the printed board unit 1 according to the present embodiment, the concern is that crosstalk may easily occur. Under such conditions, to decrease the coupling capacitance between the vias 4 is advantageous in reducing the crosstalk noise.

Figure 11:
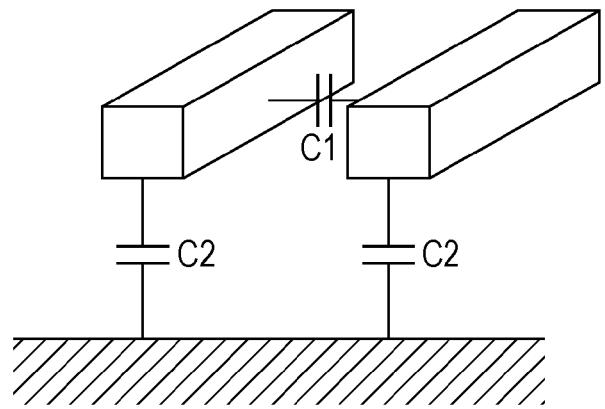
FIG. 11 is a first conceptual view for explaining a crosstalk voltage.

A crosstalk voltage V0 of a through via that causes crosstalk noise, which is hereinafter referred to as a "target via", may be calculated based on the following expression:

$$V0(t) \propto C1/(C1+C2) \times V1(t) \qquad (1),$$

where C1 represents the coupling capacitance between the target via and the through via adjacent to the target via, hereinafter referred to as the "adjacent via", C2 represents the earth capacitance of the target via that causes the crosstalk noise, V1 represents the signal voltage of the adjacent via that is a noise source, and t represents time. FIG. 11 is a conceptual view for explaining the crosstalk voltage. According to the expression (1) indicated above, approaches to reduce the crosstalk noise (crosstalk voltage) include a technique of decreasing the coupling capacitance between the target via and the adjacent via.

Figure 12:
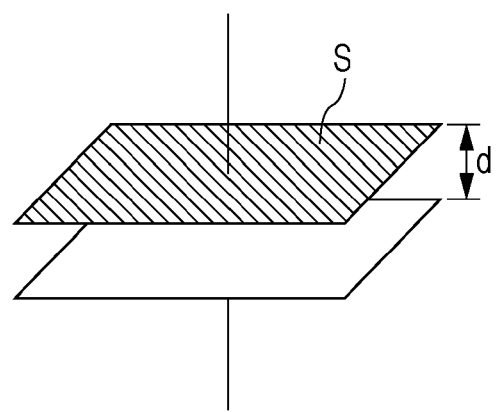
FIG. 12 is a second conceptual view for explaining the crosstalk voltage.

Furthermore, as illustrated in FIG. 12, a capacitor capacitance C of a pair of parallel flat plates may be calculated according to the following expression (2):

$$C = \in r \times S/d \quad (2),$$

where $\in r$ represents a dielectric constant, S represents the area of the parallel flat plate, and d represents the clearance between the parallel flat plates.

According to the expression (2) indicated above, when the dielectric constant $\in r$ is taken into account under certain conditions, it may be understood that to increase the clearance d between the flat plates or to decrease the area S of the parallel flat plate may reduce the capacitor capacitance C of the pair of parallel flat plates. Thus, the coupling capacitance between the target via and the adjacent via may be reduced by increasing the clearance between the target via and the adjacent via or decreasing the area of a portion in which the target via and the adjacent via face each other. The area of the portion in which the target via and the adjacent via face each other indicates the area of a portion in which the conductor portions of the target via and the adjacent via face each other.

Typically, reducing the coupling capacitance between the target via and the adjacent via and the crosstalk voltage of the target via is attempted by increasing the clearance between the target via and the adjacent via. In recent years, however, the reduction in pitches of the coupling terminals of a semiconductor element has been promoted because of the demand for the higher density of the semiconductor element, such as LSI. Thus, it may be sometimes difficult to ensure the clearance between the through vias while reducing the crosstalk voltage of the through via to a desired level. Besides, it is expected that the transmission speed may be further higher than the current transmission speed and the crosstalk voltage of the through via may easily increase in the future.

Figure 13:
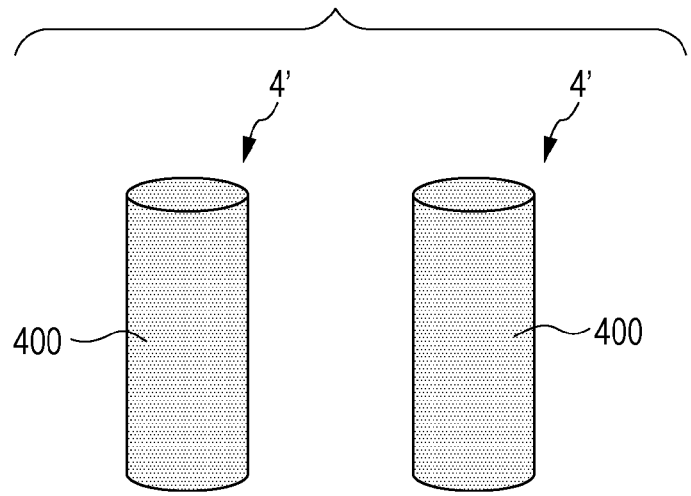
FIG. 13 is a conceptual view illustrating a pair of typical vias adjacent to each other.

In contrast, in the present embodiment, as illustrated in FIG. 10, the via 4 (electrode chip 40) has a spiral shape and the conductor portion 400 is formed in a partial region in the through hole 5 instead of covering the entire region in the through hole 5 with the conductor portion. Thus, in a given pair of adjacent vias 4, the conductor portion 400 of one of the vias 4 may be arranged while facing the non-conductor portion 401 of the other via 4. As a result, in the pair of adjacent vias 4, the area of the portion in which the conductor portions 400 face each other, which is hereinafter also referred to as the "conductor facing area", may be decreased, compared to a typical through via. The typical through via as used herein indicates a through via formed by coating the inner circumferential surface of the through hole with a conductor film or filling all the inside of the through hole with a conductor portion. FIG. 13 is a conceptual view illustrating a pair of typical vias 4' adjacent to each other. The typical via 4' is formed by the conductor portion 400 filled into the through hole.

Figure 14:
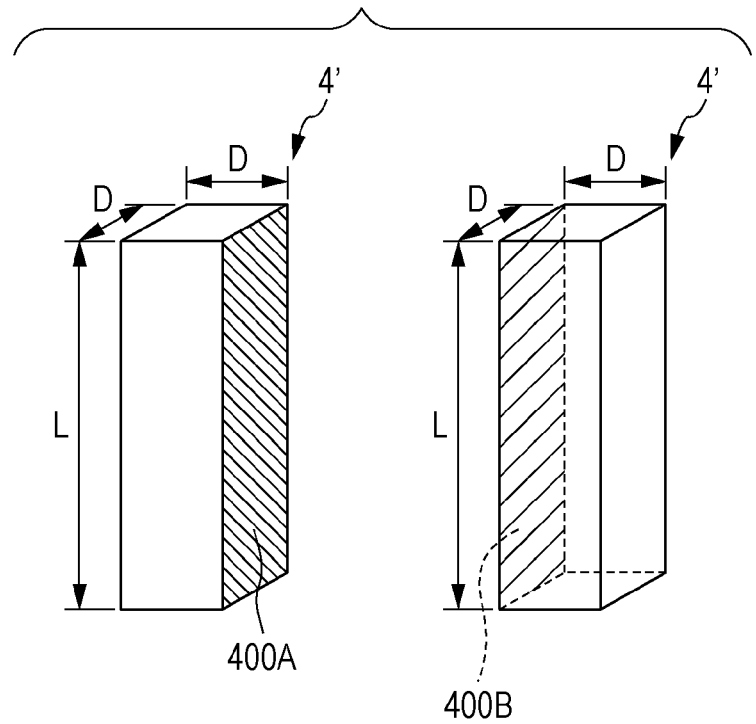
FIG. 14 is a view for explaining a conductor facing area of the pair of vias according to a prior art example.
Figure 15:
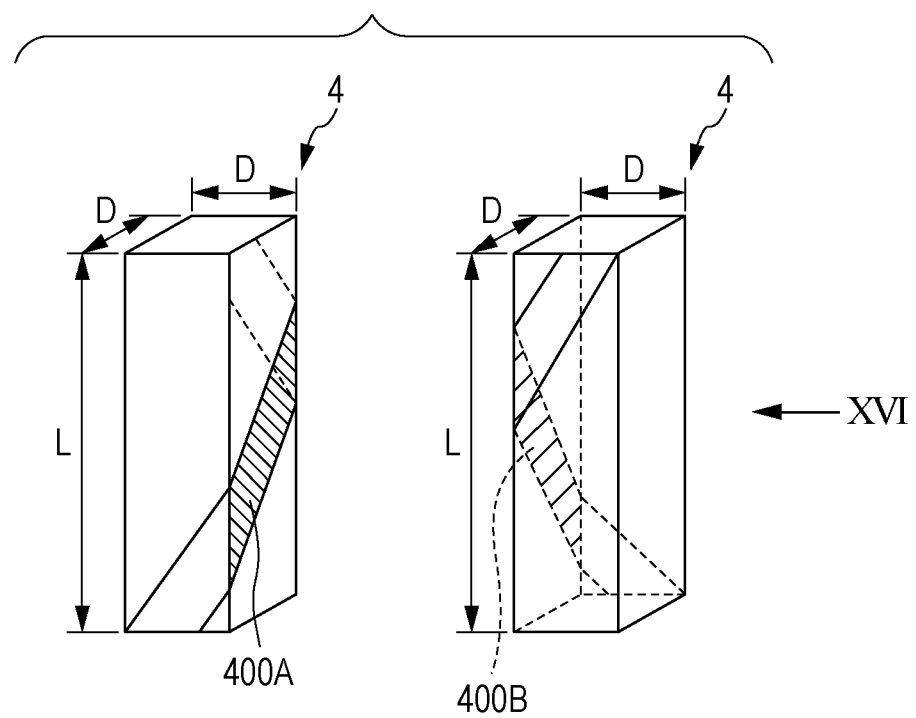
FIG. 15 is a first view for explaining a conductor facing area of a pair of vias according to the embodiment.

FIGS. 14 and 15 are now used to compare a conductor facing area S1 of the pair of vias 4' according to a prior art example with a conductor facing area S2 of the pair of vias 4 according to the present embodiment. FIG. 14 is a view for explaining the conductor facing area S1 of the vias 4' according to the prior art example and illustrates the vias 4' by simplifying the typical vias 4' into square poles. FIG. 15 is a view for explaining the conductor facing area S2 of the vias 4 according to the present embodiment by simplifying the typical vias 4' into square poles. In FIGS. 14 and 15, D represents the via diameter of the via 4 according to the present embodiment or the typical via 4', P represents the clearance between the pair of adjacent vias 4 or the vias 4', and L represents the via depth of the via 4 or the via 4'.

Referring first to FIG. 14, the area of the hatched portion in which the conductor portion 400A and the conductor portion 400B overlap each other corresponds to the conductor facing area S. Thus, the conductor facing area S1 may be calculated as the area obtained by multiplying the via diameter D and the via depth L (S1=D×L).

Figure 16:
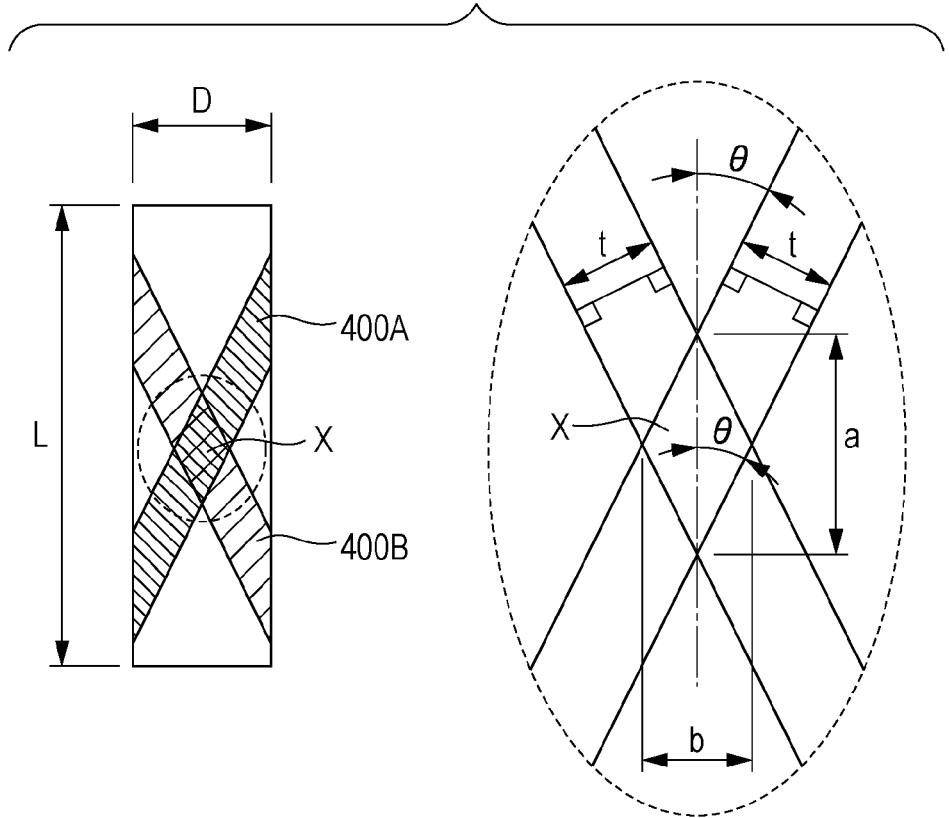
FIG. 16 is a second view for explaining the conductor facing area of a pair of vias according to the embodiment.

Referring next to FIG. 15, the area of the hatched portion in which the conductor portions 400A and 400B of the vias 4 overlap each other corresponds to the conductor facing area S2. FIG. 16 is illustrated by superposing parallel projection views obtained by viewing the via 4 from a viewpoint XVI (see FIG. 15) perpendicular to each of the facing surfaces of the vias 4. The area of the portion in which the conductor portions 400A and 400B of the facing surfaces of the vias 4 overlap each other in FIG. 16, which is hereinafter referred to as a "conductor facing portion X", that is, the conductor facing area S2 may be calculated as indicated below.

As illustrated in FIG. 16, the shape of the conductor facing portion X may approximate a diamond shape having diagonal lines a and b. The diagonal lines a and b of the conductor facing portion X may be expressed using the core thickness t, which is the core thickness of the core material 41 in the electrode chip 40 (see FIG. 3), and a torsion angle θ of the electrode chip 40. Specifically, the diagonal lines a and b may be calculated based on expressions (3) and (4) indicated below. Then, the conductor facing area S2 may be determined based on the expression (5).

$$a = t/\sin\theta \quad (3)$$

$$b = t/\cos\theta \quad (4)$$

$$S2 = a \times b/2 = t^2/(\sin\theta \times \cos\theta \times 2) \quad (5)$$

When for example, the core thickness t of the electrode chip 40 is equivalent to 50% of the via diameter D (chip diameter D), the torsion angle θ is 5 degrees, the via diameter D is 0.2 mm, and the via depth L is 1.8 mm, the conductor facing areas S1 and S2 may be calculated into the values indicated below. That is, the conductor facing area S1 amounts to 0.36 mm² and the conductor facing area S2 amounts to 0.058 mm², which indicates that the conductor facing area S2 is calculated as the area having a size of approximately 16% of the conductor facing area S1.

When C1a represents the coupling capacitance of the typical vias 4' and C1b represents the coupling capacitance of the vias 4 according to the present embodiment, the coupling capacitance C1b may be calculated with the equation C1b=0.16×C1a. Furthermore, a crosstalk voltage V0b(t) of the target via, which is one of the pair of adjacent vias 4, may be determined based on the following expression (6):

$$V0b(t) \propto (C1a \times 0.16/(C1a \times 0.16 + C2) \times V1(t) \quad (6).$$

When it is assumed that the earth capacitance of the target via is equal to the coupling capacitance C1a, the crosstalk voltage V0b(t) of the target via, which is one of the vias 4, amounts to approximately 14% of the signal voltage V1(t) of the adjacent via that is a noise source, that is, the other via 4 (V0b(t)∝0.14×V1(t)).

As described above, since a spiral structure is employed for the via 4 in the present embodiment, the conductor portion 400 of one of the pair of adjacent vias 4 may be arranged so as to face the non-conductor portion 401 of the other via 4. As a result, the area of the portion in which the conductor portions 400 are arranged while facing each other may be reduced in a given pair of adjacent vias 4 more desirably. Accordingly, the coupling capacitance between the adjacent vias 4 may be decreased and as a result, the voltage level of the crosstalk noise may be made relatively small. The crosstalk between the adjacent vias 4 may be suppressed and the crosstalk noise may be reduced without using a technique of increasing the clearance P between the vias 4. Thus, in the printed board 2 and the printed board unit 1, to which the vias 4 according to the present embodiment are applied, the occurrence of the crosstalk noise may be suppressed even when the clearance between the vias 4 is small.

Since the via 4 (electrode chip 40) according to the present embodiment has a spiral shape, the conductor portion 400 of one of the pair of adjacent vias 4 may be caused to face the non-conductor portion 401 of the other via 4 without performing synchronization on the electrode chips 40 inserted into the adjacent through holes 5. That is, when inserting the electrode chips 40 into the through holes 5, it may be undesired to cause the electrode chips 40 inserted into the adjacent through holes 5 to face each other and thus, the number of manufacturing operations may be reduced.

In addition, it may be satisfactory in the present embodiment that the conductor portion 400 of one of the pair of vias 4 is arranged so as to face the non-conductor portion 401 of the other via 4 at least in a partial section in the direction in which the vias 4 extend, that is, the axis direction. Thus, the area of the portion in which the conductor portions 400 of both of the adjacent vias 4 face each other may be reduced. As a result, the coupling capacitance of the vias 4 may be reduced and the occurrence of the crosstalk noise may be suppressed.

The conductor portions 400 of the plurality of vias 4 provided to the printed board 2 are turned to wind in an identical direction. Accordingly, the area of the portion in which the conductor portions 400 of the pair of the vias 4 adjacent to each other face each other may be further reduced. As a result, the crosstalk noise may be reduced more preferably. Since the signal lines 24 of the first layer L1 and the fourth layer L4 are electrically coupled, the vias 4 according to the present embodiment may easily suffer the crosstalk accompanied by the high-speed transmission of signals. However, in the printed board 2 according to the present embodiment, the vias 4 having a spiral structure are employed to reduce the coupling capacitance of the vias 4 and thus, the occurrence of the crosstalk noise may be advantageously suppressed.

[Variations]

Figure 17:
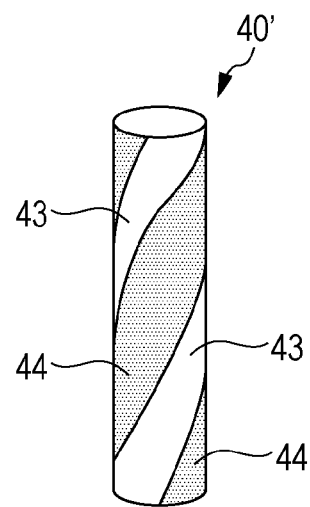
FIG. 17 is a first view illustrating an electrode chip according to a variation of the embodiment.

A number of variations may be employed for the electrode chip 40, the via 4, the printed board 2, and the printed board unit 1 according to the present embodiment. FIG. 17 is a view illustrating an electrode chip 40' according to a variation of the embodiment. The electrode chip 40' illustrated in FIG. 17 includes a body portion 43, which is a conductor chip having a spiral shape, and an insulation portion 44 that includes an insulator formed in a portion corresponding to the groove portion. The insulation portion 44 is made by, for example, adding powder of an insulator to the periphery of the body portion 43 and performing firing. Examples of the insulator include an insulator obtained by mixing alumina ceramics and glass components. However, the insulator is not limited to such an insulator and may be made of various materials. Furthermore, the insulation portion 44 may be formed by hardening insulation resin, such as epoxy resin.

As illustrated in FIG. 17, the outside diameter D of the electrode chip 40' is equal to the diameter of the above-described through hole 5 made into the printed board 2. The via 4 is formed by inserting (embedding) the electrode chip 40' into the through hole 5 instead of the electrode chip 40 described above. In this case, the body portion 43 of the electrode chip 40' forms the conductor portion 400 of the via 4. Furthermore, the insulation portion 44 of the electrode chip 40' forms the non-conductor portion 401 of the via 4. Accordingly, when soldering the semiconductor element 3 to the printed board 2, flow of the solder into the through hole 5 may be suppressed. That is, increase in the conductor facing area between the vias 4, which is caused by the solder flowing into the through hole 5, may be suppressed. Thus, the crosstalk noise that occurs in the via 4 may be suppressed more preferably.

FIGS. 18A to 18D illustrate other variations of the electrode chip used to form a pair of adjacent through vias. In a pair of vias 4, 40A represents an electrode chip that forms a via 4A, which corresponds to one of the pair of vias 4, and 40B represents an electrode chip that forms a via 4B, which corresponds to the other via 4.

Figure 18A:
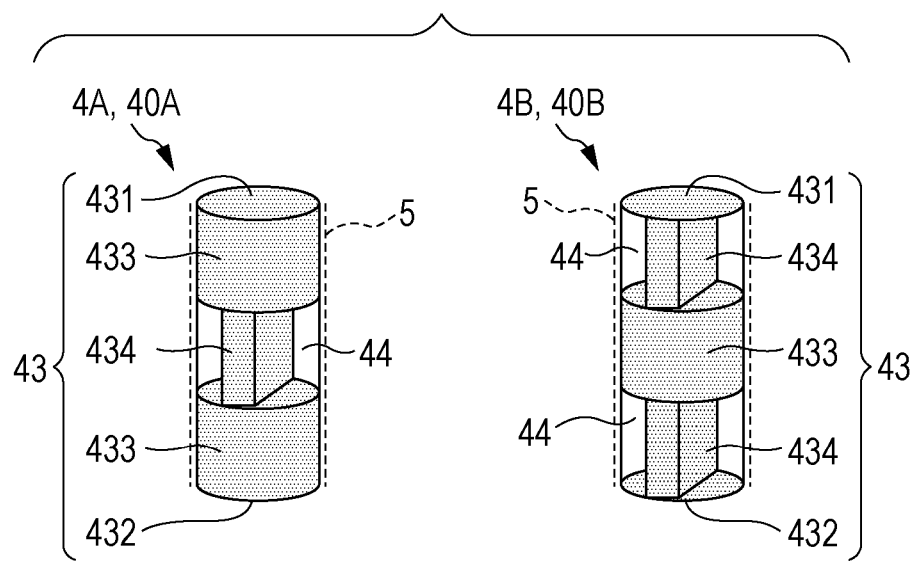
FIG. 18A is a second view illustrating an electrode chip according to a variation of the embodiment.

In FIG. 18A, the electrode chips 40A and 40B include body portions 43, which are conductors, and insulation portions 44, and each of the electrode chips 40A and 40B is formed like a cylinder as a whole. The body portion 43 includes a top end portion 431 and a bottom end portion 432, which are shaped like discs. Cylinder portions 433, which are shaped like cylinders, and wall portions 434, which are shaped like flat plates, are combined and arranged as appropriate between the top end portion 431 and the bottom end portion 432. For example, in the electrode chip 40A, the cylinder portions 433 are coupled to the top end portion 431 and the bottom end portion 432, respectively, and the cylinder portions 433, which make up a pair, are coupled to each other through the wall portion 434. In the electrode chip 40B, the wall portions 434, which make up a pair, are coupled to each other through the cylinder portion 433. That is, the cylinder portions 433 and the wall portions 434 are formed at alternate positions (heights) in the electrode chips 40A and 40B. On both sides of the wall portion 434, the insulation portions 44 are formed so as to sandwich the wall portion 434. Furthermore, each diameter of the top end portion 431, the bottom end portion 432, and the cylinder portion 433 is the same as the diameter of the through hole 5.

The vias 4A and 4B are formed by embedding the electrode chips 40A and 40B into the through holes 5, respectively. Accordingly, the body portions 43 of the electrode chips 40A and 40B form the conductor portions 400 of the vias 4A and 4B. Also, the insulation portions 44 of the electrode chips 40A and 40B form the non-conductor portions 401 of the vias 4A and 4B.

As illustrated, in the pair of adjacent vias 4A and 4B, the cylinder portions 433 of the electrode chip 40A are arranged at the same height as the height of the wall portions 434 and the insulation portions 44 of the electrode chip 40B. The cylinder portion 433 of the electrode chip 40B is arranged at the same height as the height of the wall portion 434 and the insulation portions 44 of the electrode chip 40A. The cylinder portions 433 and the insulation portions 44 of the electrode chips 40A and 40B are directed so that the cylinder portions 433 face the insulation portions 44. That is, when embedding the electrode chip 40A (40B) into the through hole 5, the cylinder portion 433 is caused to face the insulation portion 44 of the adjacent electrode chip 40B (40A) instead of being caused to face the wall portion 434 of the adjacent electrode chip 40B (40A). To cause the pair of vias 4A and 4B (electrode chips 40A and 40B) to face each other in this manner may reduce the area of the portion in which the conductor portions 400 of the vias 4A and 4B face each other. As a result, the coupling capacitance of the vias 4A and 4B may be decreased and the occurrence of the crosstalk noise may be suppressed.

Figure 18B:
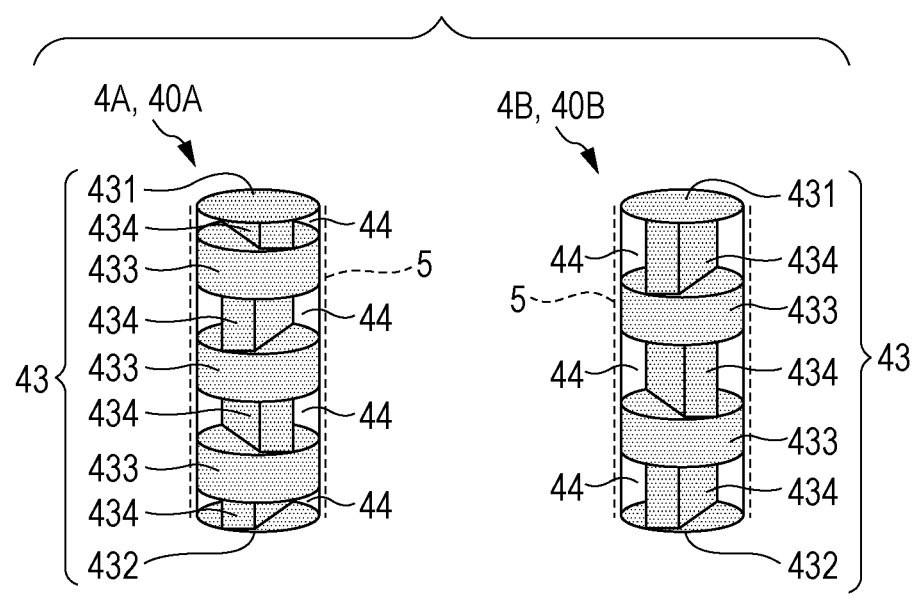
FIG. 18B is a third view illustrating an electrode chip according to a variation of the embodiment.

In the electrode chips 40A and 40B, the numbers or the heights of the cylinder portions 433 and the wall portions 434 may be freely changed. For example, FIG. 18B illustrates a variation of the electrode chips 40A and 40B illustrated in FIG. 18A. The numbers of the cylinder portions 433 and the wall portions 434 that are arranged in the pair of the electrode chips 40A and 40B illustrated in FIG. 18B are increased, compared with the electrode chips 40A and 40B illustrated in FIG. 18A.

Figure 18C:
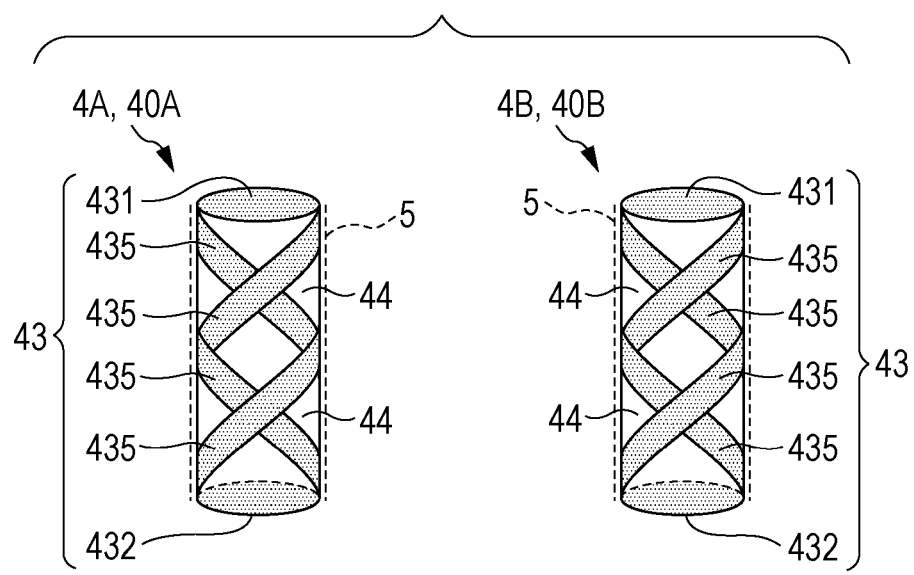
FIG. 18C is a fourth view illustrating an electrode chip according to a variation of the embodiment.

FIG. 18C is described now. Each of the pair of the electrode chips 40A and 40B illustrated in FIG. 18C includes a top end portion 431, a bottom end portion 432, and a mesh portion 435 as a body portion 43. The mesh portion 435 is made by forming a conductor into a mesh shape, and is arranged between the top end portion 431 and the bottom end portion 432 while coupling the top end portion 431 and the bottom end portion 432. Similar to the examples illustrated in FIGS. 18A and 18B, each of the electrode chips 40A and 40B includes the body portions 43 and the insulation portions 44 and has a cylinder shape as a whole. The mesh portions 435 are exposed through the surfaces of the insulation portions 44 on the sides of the electrode chips 40A and 40B.

The mesh portions 435 of the electrode chip 40A (40B) may be caused to face the insulation portions 44 of the electrode chip 40B (40A) by embedding the electrode chips 40A and 40B illustrated in FIG. 18C into the adjacent through holes 5. Thus, the area of the portion in which the conductor portions 400 face each other may be reduced in the vias 4A and 4B. As a result, the coupling capacitance of the vias 4A and 4B may be decreased and the occurrence of the crosstalk noise may be suppressed.

Figure 18D:
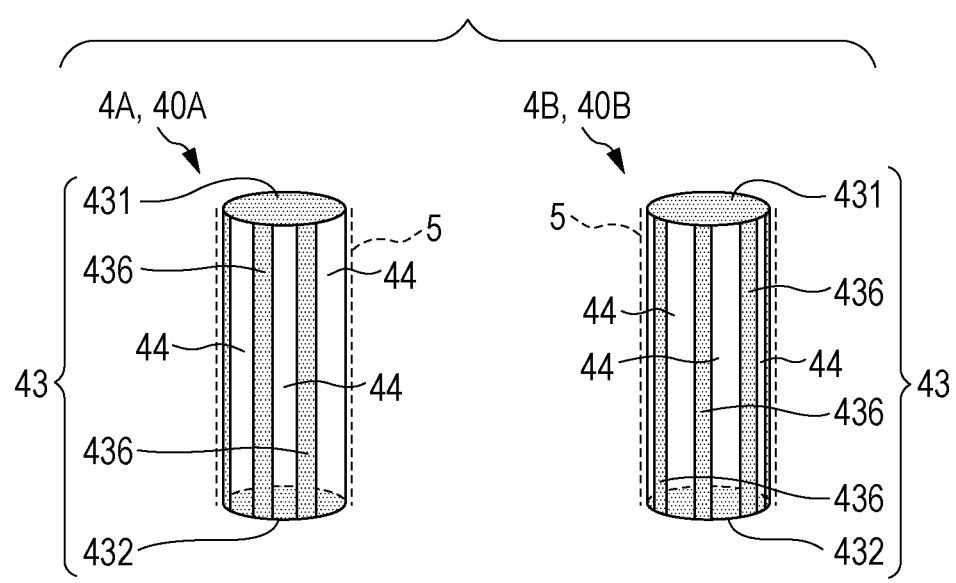
FIG. 18D is a fifth view illustrating an electrode chip according to a variation of the embodiment.

FIG. 18D is described next. Each of a pair of electrode chips 40A and 40B illustrated in FIG. 18D includes a top end portion 431, a bottom end portion 432, and a plurality of vertical frame portions 436, which connect the top end portions 431 and the bottom end portions 432, as a body portion 43, which is a conductor. The plurality of vertical frame portions 436 are arranged radially, and each of the vertical frame portions 436 couples edge portions of the top end portion 431 and the bottom end portion 432. Similar to the examples illustrated in FIGS. 18A to 18C, each of the electrode chips 40A and 40B includes a body portion 43 and an insulation portion 44 and has a cylinder shape as a whole. The plurality of vertical frame portions 436 are arranged over the side surfaces of the electrode chips 40A and 40B at certain clearances while being exposed. That is, the vertical frame portions 436 and the insulation portions 44 are arranged over the side surfaces of the electrode chips 40A and 40B while lying alternately.

When embedding the electrode chips 40A and 40B illustrated in FIG. 18D into the adjacent through holes 5, the vertical frame portions 436 of the electrode chip 40A (40B) are caused to face the insulation portions 44 of the electrode chip 40B (40A). Thus, the area of the portion in which the conductor portions 400 face each other in the vias 4A and 4B may be reduced. As a result, the coupling capacitance of the vias 4A and 4B may be decreased and the occurrence of the crosstalk noise may be suppressed. Although in the examples illustrated in FIGS. 18A to 18D, the insulation portions 44 are included to form the electrode chips 40A and 40B, the insulation portions 44 may be omitted. That is, only the body portions 43, which are conductors, may form the electrode chips 40A and 40B.

Although in the above-described embodiment, the printed board 2 has a four-layer structure, the layer structure of the printed board 2 may be changed as appropriate. Also, the inner layers of the printed board 2, which are the second layer L2 and the third layer L3, may be wiring layers that include signal lines instead of being a power supply layer or a ground layer. In this case, the wiring layers formed in the inner layers, which are the second layer L2 and the third layer L3, of the printed board 2 may be coupled through the vias 4.

In the present embodiment, the via 4 is formed as a through via by embedding the electrode chip 40 into the through hole 5 passing through the printed board 2 but is not limited thereto. For example, the electrode chip 40 having a spiral shape as illustrated in FIG. 2, or the electrode chips according to the variations illustrated in each of FIGS. 17 and 18A to 18D may be applied to the vias for coupling certain layers in the printed board 2. Furthermore, although in the present embodiment, the printed board 2 is a multilayer printed board including three or more wiring layers, for example, a double-sided printed board (two-layer plate) may be employed instead to couple the wiring layers of the surfaces with the vias 4.

Although the electrode chip 40, the via 4, the printed board 2, and the printed board unit 1 according to the present application are described above based on the embodiment, the present application is not limited thereto.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. A printed board comprising:
a first conductor layer; a second conductor layer provided to a layer different from the first conductor layer;
an insulation layer provided between the first conductor layer and the second conductor layer;
a plurality of through holes that pass through the first conductor layer, the second conductor layer, and the insulation layer; and
a plurality of vias that are formed in the plurality of through holes, respectively, and couple the first conductor layer and the second conductor layer, each of the plurality of vias including a conductor portion that occupies part of an internal space of the through hole, and a non-conductor portion that occupies remaining part of the internal space,
wherein the conductor portion has a spiral shape;
wherein the spiral shape of the conductor portion is formed by twisting a core material with a core width corresponding to a diameter of one of the plurality of vias and a core thickness smaller than the core width.
2. The printed board according to claim 1, wherein, in a given pair of vias adjacent to each other, the conductor portion of one of the pair of vias is arranged so as to face the non-conductor portion of another one of the pair of vias.

3. The printed board according to claim 1, wherein the conductor portion is turned to wind in an identical direction in each of the plurality of vias.

4. The printed board according to claim 1, wherein the non-conductor portion of each of the plurality of the vias is an insulator.

5. The printed board according to claim 1, wherein the first conductor layer and the second conductor layer include a signal line.

6. The printed board according to claim 1, wherein the non-conductor portion of each of the plurality of vias is a groove portion.

7. The printed board according to claim 1, wherein the core thickness is 40% to 50% of the diameter of the one of the plurality of vias.

8. A printed board unit comprising:
   a printed board and a semiconductor element mounted over a surface of the printed board:
   wherein the printed board includes: a first conductor layer; a second conductor layer provided to a layer different from the first conductor layer;
   an insulation layer provided between the first conductor layer and the second conductor layer;
   a plurality of through holes that pass through the first conductor layer, the second conductor layer, and the insulation layer; and
   a plurality of vias that are formed in the plurality of through holes, respectively, and couple the first conductor layer and the second conductor layer, each of the plurality of vias including a conductor portion that occupies part of an internal space of the through hole, and a non-conductor portion that occupies remaining part of the internal space,
   wherein the conductor portion has a spiral shape;
   wherein the spiral shape of the conductor portion is formed by twisting a core material with a core width corresponding to a diameter of one of the plurality of vias and a core thickness smaller than the core width.

9. The printed board unit according to claim 8, wherein, in a given pair of vias adjacent to each other, the conductor portion of one of the pair of vias is arranged so as to face the non-conductor portion of another one of the pair of vias.

10. The printed board unit according to claim 8, wherein the non-conductor portion of each of the plurality of vias is an insulator.

11. The printed board unit according to claim 8, wherein the non-conductor portion of each of the plurality of vias is a groove portion.

12. The printed board unit according to claim 8, wherein the core thickness is 40% to 50% of the diameter of the one of the plurality of vias.

13. A method of manufacturing a printed board that includes a first conductor layer, a second conductor layer provided to a layer different from the first conductor layer, and an insulation layer provided between the first conductor layer and the second conductor layer, the method comprising:
   forming a plurality of through holes at a plurality of positions, the plurality of through holes passing through the first conductor layer, the second conductor layer, and the insulation layer; and
   forming a plurality of vias, each having a spiral shape, in the plurality of through holes, respectively, the plurality of vias coupling the first conductor layer and the second conductor layer, each of the plurality of vias is formed in an internal space of the through hole so that a conductor portion that occupies part of the internal space and a non-conductor portion that occupies remaining part of the internal space are formed,
   wherein the plurality of vias are formed by twisting a core material with a core width corresponding to a diameter of one of the plurality of vias and a core thickness smaller than the core width.

14. The method according to claim 13, wherein, in a given pair of vias adjacent to each other, the conductor portion of one of the pair of vias is arranged so as to face the non-conductor portion of another one of the pair of vias.

15. The method according to claim 13, wherein the core thickness is 40% to 50% of the diameter of the one of the plurality of vias.

16. The method according to claim 13, wherein the non-conductor portion of each of the plurality of the vias is an insulator.

17. The method according to claim 13, wherein the non-conductor portion of each of the plurality of vias is a groove portion.

* * * * *